(12) United States Patent
Someya et al.

(10) Patent No.: US 8,258,492 B2
(45) Date of Patent: Sep. 4, 2012

(54) DIFFERENTIAL EVACUATION SYSTEM

(75) Inventors: Hiroshi Someya, Hiratsuka (JP); Yukio Watanabe, Hiratsuka (JP)

(73) Assignee: Gigaphoton Inc., Oyama-shi, Tochigi-ken (JP)

( * ) Notice: Subject to any disclaimer, the term of this patent is extended or adjusted under 35 U.S.C. 154(b) by 159 days.

(21) Appl. No.: 12/631,258

(22) Filed: Dec. 4, 2009

(65) Prior Publication Data

US 2010/0181498 A1 Jul. 22, 2010

(30) Foreign Application Priority Data

Dec. 4, 2008 (JP) ................................. 2008-309878

(51) Int. Cl.
*G21G 5/00* (2006.01)
(52) U.S. Cl. ..................... 250/492.2; 250/306; 250/307; 250/492.1; 250/492.3
(58) Field of Classification Search ............... 250/492.1, 250/492.2, 492.3, 306, 307
See application file for complete search history.

(56) References Cited

U.S. PATENT DOCUMENTS 6,236,054 B1 * 5/2001 Barna et al. .................... 250/427
6,331,227 B1 * 12/2001 Dykstra et al. ........... 156/345.29

FOREIGN PATENT DOCUMENTS

JP 2004-103731 A 4/2004
* cited by examiner

*Primary Examiner* — Michael Maskell
*Assistant Examiner* — Hanway Chang
(74) *Attorney, Agent, or Firm* — Westerman, Hattori, Daniels & Adrian, LLP

(57) ABSTRACT

[Technical Problem] To provide a differential evacuation system capable of easily maintaining, at a low cost, a large differential pressure between a light generation chamber and an illumination optical chamber in which optical processing, e.g. exposure, is performed by using extreme ultraviolet (EUV) light generated in the light generation chamber, and yet capable of sufficiently ensuring a desired optical path.
[Solution to Problem] The differential evacuation system has a light generation chamber 10 that generates EUV light, an illumination optical chamber 100 in which optical processing is performed by using the EUV light generated in the light generation chamber 10, and a chamber connecting passage 150 that connects together the light generation chamber 10 and the illumination optical chamber 100 to guide the EUV light generated in the light generation chamber 10 into the illumination optical chamber 100. The chamber connecting passage 150 has a flow path constricting portion 151 and is increased in inner diameter in a conical tube shape at portions thereof that are at opposite sides, respectively, of the flow path constricting portion 151. An enlarged-diameter part 160 is provided at a position of the chamber connecting passage 150 that is closer to the light generation chamber 10, which is the higher in pressure of the two chambers 10 and 100, than the flow path constricting portion 151, and vacuum pumps 170 are attached to the enlarged-diameter part 160.

15 Claims, 12 Drawing Sheets

DIFFERENTIAL EVACUATION SYSTEM

TECHNICAL FIELD

The present invention relates to a differential evacuation system suitable for use in the manufacture of semiconductor wafers or the like using a photolithography technique.

BACKGROUND ART

Conventionally, semiconductor devices such as semiconductor memories are manufactured by a method using a reduced projection exposure apparatus in which a circuit pattern drawn on a reticle or a mask is projected onto a wafer or the like through a projection optical system to transfer the circuit pattern to the wafer. The smallest size (resolution) of a circuit pattern that can be transferred by the reduced projection exposure apparatus is proportional to the wavelength of light used for exposure. Therefore, the shorter the wavelength, the higher the resolution. Accordingly, the wavelength of light used for exposure is becoming shorter and shorter with the increasing demand for finer semiconductor devices. Thus, progressively shorter wavelengths of ultraviolet light have been put into use for exposure, i.e. KrF excimer laser (wavelength: about 248 nm), and ArF excimer laser (wavelength: about 193 nm). The photolithography using such ultraviolet light, however, cannot comply with the demand for even finer semiconductor devices. Under these circumstances, there has recently been developed a reduced projection exposure apparatus using extreme ultraviolet (EUV) light having a shorter wavelength than those of ultraviolet light, i.e. a wavelength of the order of 10 nm to 15 nm (such a reduced projection exposure apparatus will hereinafter be referred to as "an EUV exposure apparatus").

A laser-produced plasma (LPP) light source, for example, is used as an EUV light source of an EUV exposure apparatus. The LPP light source utilizes EUV light having a wavelength of the order of 13.5 nm, for example, which is emitted from a high-temperature plasma generated by applying high-intensity pulsed laser to a target material placed in a vacuum chamber. Examples of target materials used for this purpose include xenon (Xe) gas, droplet, cluster, etc. tin (Sn) droplet, and lithium (Li) droplet. The target material is supplied into the vacuum chamber by a droplet generator or other similar means.

In the EUV exposure apparatus, a light generation section having the EUV light source and a section subsequent to the light generation section, in which optical processing, e.g. exposure, is performed by using EUV light generated in the light generation section, are different from each other in service conditions. The LPP light source generates a plasma by applying high-luminance pulsed laser light to a target in an EUV light generation chamber, thereby generating EUV light. During the laser irradiation, scattering particles and ions known as debris are undesirably produced from the target. The debris contaminates and damages a mirror that converges EUV light, causing a degradation of the reflectance. To reduce the degradation of the reflectance of the EUV light converging mirror by the debris, a buffer gas, e.g. He, is conventionally supplied into the light generation chamber. Accordingly, the pressure in the light generation chamber is about 10 Pa.

On the other hand, the pressure in an apparatus that applies EUV light to a mask to perform exposure is required to be about $10^{-7}$ Pa. Patent Literature 1 (FIG. 12) proposes a differential evacuation system that realizes the pressure difference between the light generation chamber and the exposure apparatus. An EUV exposure apparatus in Patent Literature 1 includes a light generation chamber having an EUV light source and an illumination optical chamber in which optical processing, e.g. exposure, is performed by using light generated in the light generation chamber. A turbomolecular pump is installed between the light generation chamber and the illumination optical chamber. The rotating shaft of the turbomolecular pump is made hollow to allow light to pass through the hollow inside of the rotating shaft, thereby forming a chamber connecting passage. The two chambers are evacuated individually, and at the same time, the turbomolecular pump is driven to evacuate gas molecules leaking through the chamber connecting passage from the high-pressure side chamber toward the low-pressure side chamber, thereby introducing light generated in the light generation chamber into the illumination optical chamber through the chamber connecting passage while maintaining a large pressure difference between the two chambers.

The reason why the chamber connecting passage is evacuated by the turbomolecular pump installed between the two chambers as stated above is that a large pressure difference cannot be maintained between the two chambers simply by connecting together the two chambers, which are evacuated individually, through the chamber connecting passage. It should be noted that the chamber connecting passage cannot be closed with a filter because EUV light is passed therethrough (it is difficult to produce a filter material having a high transmittance in the wavelength region of EUV light).

In the differential evacuation system disclosed in the following Patent Literature 1, however, only one turbomolecular pump can be installed. Therefore, when a large differential pressure is required, it is necessary to greatly increase the external size of the turbomolecular pump to increase the pump capacity, or to reduce the conductance of the chamber connecting passage provided in the turbomolecular pump (i.e. the passage diameter is reduced to increase the resistance to the passage of gas molecules). However, the turbomolecular pump has a special structure and hence a high production cost. If the turbomolecular pump is increased in size, the production cost becomes higher. On the other hand, it is difficult to reduce the conductance because it is necessary to sufficiently ensure a desired optical path.

[Patent Literature 1] Japanese Patent Application Publication No. 2004-103731

DISCLOSURE OF INVENTION

Technical Problem

The present invention has been made in view of the above-described circumstances. An object of the present invention is to provide a differential evacuation system capable of easily maintaining, at a low cost, a large differential pressure between a light generation chamber having an EUV light source and an illumination optical chamber in which optical processing, e.g. exposure, is performed by using light generated in the light generation chamber, and yet capable of sufficiently ensuring a desired optical path.

Solution to Problem

The invention of claim 1 of this application is a differential evacuation system including a light generation chamber that generates light, an illumination optical chamber in which optical processing is performed by using the light generated in the light generation chamber, and a chamber connecting passage serving as a light passage that connects together the light generation chamber and the illumination optical chamber to guide the light generated in the light generation chamber into the illumination optical chamber. The chamber connecting passage has a flow path constricting portion with the smallest inner diameter and is increased in inner diameter at portions thereof that are at opposite sides, respectively, of the flow path constricting portion. One or a plurality of vacuum pumps are attached to a position of the chamber connecting passage that is closer to one of the light generation chamber and the illumination optical chamber that is higher in pressure than the other than at least the flow path constricting portion.

The invention of claim 2 of this application is a differential evacuation system as set forth in claim 1, in which an enlarged-diameter part is provided at a position of the chamber connecting passage that is closer to one of the light generation chamber and the illumination optical chamber that is higher in pressure than the other than at least the flow path constricting portion, and the one or plurality of vacuum pumps are attached to the enlarged-diameter part. The enlarged-diameter part is structured to have an inner diameter larger than those of portions of the chamber connecting passage that are at opposite sides, respectively, of the enlarged-diameter part.

The invention of claim 3 of this application is a differential evacuation system as set forth in claim 2, in which the plurality of vacuum pumps are attached to a side of the enlarged-diameter part.

The invention of claim 4 of this application is a differential evacuation system as set forth in claim 2, in which the plurality of vacuum pumps are attached to the outer peripheral surface of the enlarged-diameter part.

The invention of claim 5 of this application is a differential evacuation system as set forth in claim 1, in which one or a plurality of pipes are connected to a position of the chamber connecting passage that is closer to one of the light generation chamber and the illumination optical chamber that is higher in pressure than the other than at least the flow path constricting portion, and the vacuum pumps are attached to the pipes, respectively.

The invention of claim 6 of this application is a differential evacuation system including a light generation chamber that generates light, an illumination optical chamber in which optical processing is performed by using the light generated in the light generation chamber, and a chamber connecting passage serving as a light passage that connects together the light generation chamber and the illumination optical chamber to guide the light generated in the light generation chamber into the illumination optical chamber. The chamber connecting passage has a flow path constricting portion with the smallest inner diameter and is increased in inner diameter in a conical tube shape at portions thereof that are at opposite sides, respectively, of the flow path constricting portion. One or a plurality of vacuum pumps are attached to each of the portions that are at opposite sides, respectively, of the flow path constricting portion.

The invention of claim 7 of this application is a differential evacuation system as set forth in claim 6, in which the portions of the chamber connecting passage that are at opposite sides, respectively, of the flow path constricting portion are provided with enlarged-diameter parts, respectively, and the one or plurality of vacuum pumps are attached to each of the enlarged-diameter parts.

The invention of claim 8 of this application is a differential evacuation system as set forth in claim 7, in which the plurality of vacuum pumps are attached to a side of each of the enlarged-diameter parts.

The invention of claim 9 of this application is a differential evacuation system as set forth in claim 7, in which the plurality of vacuum pumps are attached to the outer peripheral surface of each of the enlarged-diameter parts.

The invention of claim 10 of this application is a differential evacuation system as set forth in claim 6, in which one or a plurality of pipes are connected to each of the portions of the chamber connecting passage that are at opposite sides, respectively, of the flow path constricting portion, and the vacuum pumps are attached to the pipes, respectively.

The invention of claim 11 of this application is a differential evacuation system including a light generation chamber that generates light, an illumination optical chamber in which optical processing is performed by using the light generated in the light generation chamber, and a chamber connecting passage serving as a light passage that connects together the light generation chamber and the illumination optical chamber to guide the light generated in the light generation chamber into the illumination optical chamber. The chamber connecting passage has a flow path constricting portion with the smallest inner diameter and is increased in inner diameter from the flow path constricting portion toward at least one of the light generation chamber and the illumination optical chamber. An enlarged-diameter part is provided at an intermediate position of the chamber connecting passage, and one or a plurality of vacuum pumps are attached to the enlarged-diameter part.

The invention of claim 12 of this application is a differential evacuation system as set forth in claim 11, in which the plurality of vacuum pumps are attached to a side of the enlarged-diameter part.

The invention of claim 13 of this application is a differential evacuation system as set forth in claim 11, in which the plurality of vacuum pumps are attached to the outer peripheral surface of the enlarged-diameter part.

Advantageous Effects of the Invention

According to the inventions of claims 1 to 5, a flow path constricting portion is provided at an intermediate position of the chamber connecting passage. Therefore, the conductance of the chamber connecting passage can be reduced. Because the chamber connecting passage has a configuration in which portions that are at opposite sides, respectively, of the flow path constricting portion are increased in inner diameter, it is possible to sufficiently ensure an optical path diverging in opposite directions away from each other from the point of convergence of light passing through the chamber connecting passage by making the light convergence point coincident with the flow path constricting portion. Further, because evacuation is performed at an optimal position in the chamber connecting passage, it is possible to perform even more effective evacuation by the vacuum pumps.

According to the invention of claim 2, the vacuum pumps are attached to an enlarged-diameter part provided at an intermediate position of the chamber connecting passage. Therefore, it is possible to easily install a plurality of vacuum pumps and hence possible to increase the differential pressure between the light generation chamber and the illumination optical chamber.

According to the invention of claim 3, the vacuum pumps can be installed so as not to project outward, which allows a reduction in the external size of the differential evacuation system. Particularly, if the vacuum pumps are installed on a side of the enlarged-diameter part in such a manner as to be circumferentially spaced from each other, it is possible to easily increase the number of vacuum pumps installed.

According to the invention of claim 4, the vacuum pumps can be favorably disposed in a situation where there is a space in the radial direction of the enlarged-diameter part but there is no much space in the axial direction of the enlarged-diameter part.

According to the inventions of claims 6 to 10, a flow path constricting portion is provided at an intermediate position of the chamber connecting passage. Therefore, the conductance of the chamber connecting passage can be reduced. Because the chamber connecting passage is increased in inner diameter in a conical tube shape at portions thereof that are at opposite sides, respectively, of the flow path constricting portion, it is possible to sufficiently ensure an optical path diverging in opposite directions away from each other from the point of convergence of light passing through the chamber connecting passage by making the light convergence point coincident with the flow path constricting portion. Further, because the vacuum pumps are installed at portions of the chamber connecting passage that are at opposite sides, respectively, of the flow path constricting portion, it is possible to easily install a large number of vacuum pumps and hence possible to easily increase the differential pressure between the light generation chamber and the illumination optical chamber.

According to the invention of claim 7, the vacuum pumps are attached to enlarged-diameter parts provided at intermediate positions, respectively, of the chamber connecting passage. Therefore, it is possible to easily install a plurality of vacuum pumps and hence possible to increase the differential pressure between the light generation chamber and the illumination optical chamber.

According to the invention of claim 8, the vacuum pumps can be installed so as not to project outward, which allows a reduction in the external size of the differential evacuation system. Particularly, if the vacuum pumps are installed on a side of each enlarged-diameter part in such a manner as to be circumferentially spaced from each other, it is possible to easily increase the number of vacuum pumps installed.

According to the invention of claim 9, the vacuum pumps can be favorably disposed in a situation where there is a space in the radial direction of the enlarged-diameter parts but there is no much space in the axial direction of the enlarged-diameter parts.

According to the invention of claim 11, a flow path constricting portion is provided at an intermediate position of the chamber connecting passage. Therefore, the conductance of the chamber connecting passage can be reduced. Because the chamber connecting passage is increased in inner diameter from the flow path constricting portion toward at least one of the light generation chamber and the illumination optical chamber, it is possible to sufficiently ensure an optical path diverging in opposite directions away from each other from the point of convergence of light passing through the chamber connecting passage by making the light convergence point coincident with the flow path constricting portion. Further, because the vacuum pumps are attached to an enlarged-diameter part provided at an intermediate position of the chamber connecting passage, it is possible to easily install a plurality of vacuum pumps and hence possible to increase the differential pressure between the light generation chamber and the illumination optical chamber.

According to the invention of claim 12, the vacuum pumps can be installed so as not to project outward, which allows a reduction in the external size of the differential evacuation system. Particularly, if the vacuum pumps are installed on a side of the enlarged-diameter part in such a manner as to be circumferentially spaced from each other, it is possible to easily increase the number of vacuum pumps installed.

According to the invention of claim 13, the vacuum pumps can be favorably disposed in a situation where there is a space in the radial direction of the enlarged-diameter part but there is no much space in the axial direction of the enlarged-diameter part.

BEST MODE FOR CARRYING OUT THE INVENTION

Embodiments of the present invention will be explained below in detail with reference to the accompanying drawings.

FIG. 1 is a schematic view showing the arrangement of a main part of a differential evacuation system 1-1 according to a first embodiment of the present invention. As shown in the figure, the differential evacuation system 1-1 has a light generation chamber 10 accommodating a plasma 11 serving as a light source that generates (emits) EUV light, an illumination optical chamber 100 in which optical processing (e.g. exposure processing for semiconductor manufacture) is performed by using EUV light generated in the light generation chamber 10, and a chamber connecting passage 150 serving as a light passage that connects together the light generation chamber 10 and the illumination optical chamber 100 to guide light generated in the light generation chamber 10 into the illumination optical chamber 100.

The light generation chamber 10 has a nozzle (target material supply means) 13 that supplies a target material (e.g. xenon (Xe) gas, droplet, cluster, etc., tin (Sn) droplet, or lithium (Li) droplet) toward the position of the plasma 11, a converging mirror 15 having a concave reflecting surface, a buffer gas introducing tank 17 installed outside the light generation chamber 10 and filled with a buffer gas, e.g. helium (He), a nozzle 18 that blows the buffer gas from the buffer gas introducing tank 17 to the neighborhood of the surface of the converging mirror 15, a transmitting window 19 attached to the outer peripheral wall of the light generation chamber 10 to transmit laser light, and a vacuum pump 21 attached to the light generation chamber 10 to maintain the inside of the light generation chamber 10 at a predetermined low pressure. The center of the converging mirror 15 is provided with a light-passing hole 15a that passes laser light introduced from the transmitting window 19. The inside of the light generation chamber 10 is maintained at a pressure of the order of about several Pa by driving the vacuum pump 21 in order to generate EUV light and to reduce the deterioration of the converging mirror 15 due to debris reaching the same.

The illumination optical chamber 100 has an optical element 101, e.g. a reflecting mirror, and a plurality of mirrors for illumination installed therein. An exposure apparatus (not shown) for semiconductor manufacture or the like is installed in the stage subsequent to the optical element 101 and the illumination mirrors. The exposure apparatus transfers the pattern of a mask illuminated with EUV light onto a wafer. Examples of the exposure apparatus include a projection exposure apparatus that transfers by exposure a circuit pattern formed on a mask onto an object to be processed by the step-and-scan method or the step-and-repeat method using EUV light (e.g. a wavelength of 13.4 nm) as illumination light for exposure, for example. A vacuum pump 103 is attached to the illumination optical chamber 100 to maintain the inside of the illumination optical chamber 100 at a predetermined degree of vacuum. The inside of the illumination optical chamber 100 is maintained at a vacuum below $1\times10^{-3}$ Pa by the vacuum pump 103 and kept under an He or other buffer gas atmosphere to prevent the contamination of the optical element 101 and other components and to maintain the reflectance of the mirror for EUV and also to prevent the attenuation of EUV light in the optical path. He and other similar buffer gases do not block EUV light at a low pressure.

The chamber connecting passage 150 is formed in a tubular configuration in which it has a flow path constricting portion 151 with the smallest inner diameter and in which portions that are at opposite sides, respectively, of the flow path constricting portion 151 are increased in inner diameter. More specifically, the portions of the chamber connecting passage 150 that are at opposite sides, respectively, of the flow path constricting portion 151 are increased in inner diameter in a conical tube shape. The term "conical tube shape" refers to a shape (trumpet-like shape) in which the chamber connecting passage 150 gradually changes in inner diameter from a small inner diameter passage portion toward a large inner diameter passage portion. That is, the chamber connecting passage 150 is tapered in conformity with the converging angle (NA: Numerical Aperture) of EUV light 203, which will be described later. The chamber connecting passage 150 has an enlarged-diameter part 160 provided at an intermediate position (a position near the flow path constricting portion 151 of the chamber connecting passage 150 and closer to the light generation chamber 10 than the flow path constricting portion 151). The enlarged-diameter part 160 has an inner diameter larger than those of portions of the chamber connecting passage 150 that are at opposite sides, respectively, of the enlarged-diameter part 160. FIG. 2 is a partly sectioned view as seen in the direction of the arrows A-A in FIG. 1. As shown in FIGS. 1 and 2, the enlarged-diameter part 160 is in the shape of a circular box, the inside of which is a closed space. The enlarged-diameter part 160 is provided so that its center axis coincides with the center axis of the chamber connecting passage 150. The enlarged-diameter part 160 has a plurality (four) of vacuum pumps 170 installed on one of mutually opposing right and left sides thereof (i.e. the side that faces the light generation chamber 10). The vacuum pumps 170 are equally spaced on a circumference centered at the center axis of the enlarged-diameter part 160.

The vacuum pumps 170 are all commercially available turbomolecular pumps of the same structure. The vacuum pumps 170 are attached to the enlarged-diameter part 160 so that the rotating shaft of each vacuum pump 170 is parallel to the center axis of the chamber connecting passage 150. The vacuum pumps 170 as installed in this orientation can be disposed in a space-saving manner because the vacuum pumps 170 do not project outward and allow a reduction in the external size of the differential evacuation system 1-1. It is also possible to easily install a large number of vacuum pumps 170 on the enlarged-diameter part 160 in such a manner as to be circumferentially spaced from each other and hence possible to easily increase the differential pressure between the chambers 10 and 100.

In the differential evacuation system 1-1 arranged as stated above, pulsed laser 201 emitted from a laser generator (not shown) and transmitted through a condenser lens passes through the transmitting window 19 and the light-passing hole 15a and is converged on a target material (e.g. tin) supplied from the nozzle 13 to generate a plasma 11. The plasma 11 emits EUV light 203, which is reflected and converged by the converging mirror 15 in order to increase the light utilization efficiency before being introduced into the chamber connecting passage 150. The above-described plasma 11 produces scattering particles known as debris together with EUV light. The adhesion of the scattering particles to the surface of the converging mirror 15 is suppressed by blowing the buffer gas from the nozzle 18 onto the surface of the converging mirror 15. Thus, the contamination and damage of the converging mirror 15 are reduced.

The EUV light introduced into the chamber connecting passage 150 is converged on a point located in the center of the flow path constricting portion 151 of the chamber connecting passage 150, thereby preventing the chamber connecting passage 150 from blocking the EUV light. The EUV light having passed through the chamber connecting passage 150 and introduced into the illumination optical chamber 100 is reflected by the optical element 101, before being introduced into an exposure apparatus (not shown) for semiconductor manufacture or the like.

As has been stated above, in this embodiment, the inside of the light generation chamber 10 is maintained under an He or other buffer gas atmosphere of a low pressure of several Pa by the vacuum pump 21, while the inside of the illumination optical chamber 100 is maintained at a vacuum below $1 \times 10^{-3}$ Pa by the vacuum pump 103. Therefore, gas molecules move through the chamber connecting passage 150 from the light generation chamber 10 toward the illumination optical chamber 100. A rise in the pressure in the illumination optical chamber 100 undesirably causes an increase in the optical path length of EUV light in the illumination optical chamber 100 and the exposure apparatus (not shown), resulting in an increase in the attenuation of the EUV light, which makes it impossible to perform exposure on the wafer. In this regard, the differential evacuation system 1-1 has a flow path constricting portion 151 with a reduced inner diameter provided at an intermediate position of the chamber connecting passage 150. Accordingly, the conductance of the chamber connecting passage 150 is small, so that it is difficult for gas molecules to pass through the chamber connecting passage 150. In addition, a part of gas molecules moving through the chamber connecting passage 150 are evacuated by driving the vacuum pumps 170. Consequently, it is possible to effectively reduce the number of gas molecules moving through the chamber connecting passage 150 from the light generation chamber 10 toward the illumination optical chamber 100 and hence possible to increase the differential pressure between the two chambers 10 and 100. Accordingly, the pressure in the illumination optical chamber 100 can be maintained at a lower level. As a result, there is substantially no attenuation of EUV light in the illumination optical chamber 100 and the exposure apparatus (not shown), thus allowing exposure on the wafer.

Particularly, in this embodiment, the vacuum pumps 170 are attached to the enlarged-diameter part 160. Therefore, it is possible to easily install a plurality of commercially available vacuum pumps 170 (having no special structure). Thus, the evacuation capacity can be increased easily. Even if the differential pressure between the light generation chamber 10 and the illumination optical chamber 100 is large, it is possible to easily cope with this situation. It should be noted that because the chamber connecting passage 150 has a configuration in which portions that are at opposite sides, respectively, of the flow path constricting portion 151 are increased in inner diameter, specifically in a conical tube shape, it is possible to sufficiently ensure an optical path diverging in opposite directions away from each other from the point of convergence of light passing through the chamber connecting passage 150 by making the light convergence point coincident with the flow path constricting portion 151.

Further, in this embodiment, the enlarged-diameter part 160 is installed at a position in the chamber connecting passage 150 near the flow path constricting portion 151 and closer to the light generation chamber 10, which is the higher in pressure of the two chambers 10 and 100. Therefore, it is possible to perform even more effective evacuation by the vacuum pumps 170. In general, turbomolecular pumps have a constant evacuation rate in the pressure region below several Pa irrespective of the suction pressure. Therefore, installing turbomolecular pumps at a higher-pressure position enables a larger amount of leaking gas to be evacuated at a small evacuation rate. Because the amount of leaking gas is determined by the conductance of the chamber connecting passage 150 between the light generation chamber 10 and the enlarged-diameter part 160 and the differential pressure, the enlarged-diameter part 160 is disposed at a position near the flow path constricting portion 151 in order to reduce the amount of leaking gas to be evacuated by the vacuum pumps 170 (i.e. to prevent the pressure in the light generation chamber 10 from being influenced by the evacuation). In other words, it is preferable, from the viewpoint of obtaining a necessary differential pressure with a vacuum pump system having as small a capacity as possible (with as small a number of vacuum pumps as possible), to determine an optimum installation position of the enlarged-diameter part 160 somewhere between the light generation chamber 10 and the flow path constricting portion 151 while taking into account the amount of leaking gas and the evacuation rate required of the pump system. In addition, because the flow path conductance is correlated with the pressure in the flow path, as the pressure reduces, the conductance decreases and eventually assumes a constant value irrespective of the pressure in a molecular flow region. Therefore, vacuum evacuation performed at an intermediate position of piping causes a pressure reduction and a decrease in the conductance in a portion of the piping downstream of the position where evacuation is performed. Accordingly, the position for vacuum evacuation, i.e. the installation position of the enlarged-diameter part 160, is preferably set near the light generation chamber 10, which is a high pressure-side chamber, and within a range in which the pressure in the light generation chamber 10 is not influenced by the evacuation of gas from the enlarged-diameter part 160. For this reason, the installation position of the enlarged-diameter part 160 is determined at the above-described position.

FIG. 3 is a schematic view showing the arrangement of a main part of a differential evacuation system 1-2 according to a second embodiment of the present invention. In the differential evacuation system 1-2 shown in FIG. 3, the members or portions identical or equivalent to those of the differential evacuation system 1-1 shown in FIGS. 1 and 2 are denoted by the same reference numerals as those used in FIGS. 1 and 2. It should be noted that the second embodiment is the same as the first embodiment shown in FIGS. 1 and 2 except the following points (the same shall apply in the following third to eighth embodiments).

The differential evacuation system 1-2 shown in FIG. 3 differs from the above-described differential evacuation system 1-1 only in that another one set of an enlarged-diameter part 160-2 and four vacuum pumps 170-2 is installed at the chamber connecting passage 150 in addition to the enlarged-diameter part 160 and the four vacuum pumps 170. The enlarged-diameter part 160-2 has the same configuration and structure as the enlarged-diameter part 160. The four vacuum pumps 170-2 also have the same configuration and structure as the four vacuum pumps 170. The enlarged-diameter part 160-2 is installed at an intermediate position of the chamber connecting passage 150, more specifically, at a position near the flow path constricting portion 151 of the chamber connecting passage 150 and closer to the illumination optical chamber 100 than the flow path constricting portion 151.

The above-described arrangement doubles the number of vacuum pumps 170 and 170-2 usable for evacuation and therefore allows effective evacuation. Accordingly, the system can easily cope with a large differential pressure between the light generation chamber 10 and the illumination optical chamber 100. It should be noted that in the following embodiments, including this, the suffix "-2" as attached to the reference numerals "160" and "170" refers to an enlarged-diameter part and vacuum pumps installed closer to one of the two chambers 10 and 100 that is lower in pressure than the other.

FIG. 4 is a schematic view showing the arrangement of a main part of a differential evacuation system 1-3 according to a third embodiment of the present invention. The differential evacuation system 1-3 shown in FIG. 4 differs from the foregoing differential evacuation system 1-1 in that the position of the enlarged-diameter part 160 installed in the chamber connecting passage 150 is near the flow path constricting portion 151 of the chamber connecting passage 150 and closer to the illumination optical chamber 100 than the flow path constricting portion 151, and in that two superconducting magnets 23 are used to prevent ions and other debris from reaching the converging mirror 15 instead of blowing a buffer gas onto the surface of the converging mirror 15, thereby reducing the degradation of the reflectance of the converging mirror 15. In this embodiment, a magnetic field is generated in a direction perpendicular to the optical axis of the converging mirror 15. Ion debris is moved in the magnetic field direction shown by the broken lines, thereby preventing ions from reaching the surface of the converging mirror 15. It is necessary in order to effectively generate such a large magnetic field to maintain a high vacuum below $1\times10^{-5}$ Pa. With this arrangement, the light generation chamber 10 needs to be maintained at a lower pressure than the illumination optical chamber 100.

In first embodiment, the illumination optical chamber 100 is lower in pressure than the light generation chamber 10, and therefore, the enlarged-diameter part 160 is installed at a position closer to the light generation chamber 10 than the flow path constricting portion 151. However, in a case where the light generation chamber 10 is lower in pressure than the illumination optical chamber 100 as in this embodiment, the enlarged-diameter part 160 should preferably be installed at a position closer to the illumination optical chamber 100. It should be noted that, depending upon cases, the enlarged-diameter part 160 may be installed at the position defined in this embodiment even when the illumination optical chamber 100 is lower in pressure than the light generation chamber 10 as in the first embodiment.

Further, both the enlarged-diameter parts 160 and 160-2 shown in FIG. 3 may be installed at a position closer to the light generation chamber 10 than the flow path constricting portion 151 or may be installed at a position closer to the illumination optical chamber 100 than the flow path constricting portion 151, although such arrangements are not illustrated.

FIG. 5 is a schematic view showing the arrangement of a main part of a differential evacuation system 1-4 according to a fourth embodiment of the present invention. The differential evacuation system 1-4 shown in FIG. 5 differs from the differential evacuation system 1-2 shown in FIG. 3 only in that one of the two enlarged-diameter parts 160 and 160-2 installed in the chamber connecting passage 150, i.e. the enlarged-diameter part 160, is formed in the shape of a substantially umbrella-shaped (substantially conical) box projecting substantially perpendicularly from the conical tube-shaped wall of the chamber connecting passage 150, and that all the rotating shafts of the four vacuum pumps 170 attached to the enlarged-diameter part 160 are set substantially parallel to the wall (outer peripheral side wall) of the chamber connecting passage 150. The vacuum pumps 170 as installed in this orientation can also be disposed in a space-saving manner because the vacuum pumps 170 do not project outward and allow a reduction in the external size of the differential evacuation system 1-4, as in the case of the foregoing embodiments. It is also possible to easily install a large number of vacuum pumps 170 on the enlarged-diameter part 160 in such a manner as to be circumferentially spaced from each other as in the case of the foregoing embodiments. It should be noted that although in this embodiment only the rotating shafts of the vacuum pumps 170 at one side of the flow path constricting portion 151 are installed substantially parallel to the wall of the chamber connecting passage 150, the rotating shafts of the vacuum pumps 170-2 at the other side of the flow path constricting portion 151 may also be installed substantially parallel to the wall of the chamber connecting passage 150. The vacuum pumps 170 of the differential evacuation systems 1-1 and 1-3 according to the first and third embodiments may also be installed with their rotating shafts extending substantially parallel to the wall of the chamber connecting passage 150.

FIG. 6 is a schematic view showing the arrangement of a main part of a differential evacuation system 1-5 according to a fifth embodiment of the present invention. FIG. 7 is a partly sectioned view as seen in the direction of the arrows B-B in FIG. 6. The differential evacuation system 1-5 shown in FIGS. 6 and 7 differs from the above-described differential evacuation system 1-3 shown in FIG. 4 in that enlarged-diameter parts 160 and 160-2 are provided at opposite sides, respectively, of the flow path constricting portion 151 of the chamber connecting passage 150 and that a plurality of vacuum pumps 170 and 170-2 (in this embodiment, four equally spaced vacuum pumps 170 and four equally spaced vacuum pumps 170-2) are attached to the respective outer peripheral surfaces of the enlarged-diameter parts 160 and 160-2. This arrangement also allows a reduction in the conductance of the chamber connecting passage 150 and makes it possible to ensure sufficiently an optical path diverging in opposite directions away from each other from the point of convergence of light and to easily install a large number of vacuum pumps 170 and 170-2 on the enlarged-diameter parts 160 and 160-2, as in the case of the foregoing embodiments. Further, the differential evacuation system 1-5 is suitable for use in a situation where there is a space in the radial direction of the enlarged-diameter parts 160 and 160-2 but there is no much space in the axial direction of the enlarged-diameter parts 160 and 160-2 (i.e. in the direction of the center axis of the chamber connecting passage 150). It should be noted that, in the first to fourth embodiments also, the vacuum pumps 170 (170-2) may be attached to the outer peripheral surface of the enlarged-diameter part 160 (160-2) as in this embodiment.

FIG. 8 is a schematic view showing the arrangement of a main part of a differential evacuation system 1-6 according to a sixth embodiment of the present invention. FIG. 9 is a partly sectioned view as seen in the direction of the arrows C-C in FIG. 8. The differential evacuation system 1-6 shown in FIGS. 8 and 9 differs from the above-described differential evacuation system 1-2 shown in FIG. 3 in that, unlike in the differential evacuation system 1-2, no enlarged-diameter parts 160 and 160-2 are provided at opposite sides, respectively, of the flow path constricting portion 151 of the chamber connecting passage 150 but a plurality of pipes 25 and 25-2 (in this embodiment, four equally spaced pipes 25 and four equally spaced pipes 25-2) are radially connected to portions of the chamber connecting passage 150 that are at opposite sides, respectively, of the flow path constricting portion 151 and vacuum pumps 170 and 170-2 are connected to the pipes 25 and 25-2. With this arrangement, although the advantageous effects produced by providing the enlarged-diameter parts 160 and 160-2 cannot be obtained, it is possible to reduce the conductance of the chamber connecting passage 150 and to sufficiently ensure an optical path diverging in opposite directions away from each other from the point of convergence of light, as in the case of the foregoing embodiments. In a case where vacuum pumps 170 are provided only at one side of the flow path constricting portion 151, the vacuum pumps 170 should preferably be installed at a position closer to one of the two chambers that is higher in pressure than the other, as in the first embodiment. Although in this embodiment a plurality (four) of vacuum pumps 170 (or 170-2) are installed, the number of vacuum pumps 170 (or 170-2) installed may be selected to be a plural number other than four or one according to need.

FIG. 10 is a schematic view showing the arrangement of a main part of a differential evacuation system 1-7 according to a seventh embodiment of the present invention. FIG. 11 is a partly sectioned view as seen in the direction of the arrows D-D in FIG. 10. The differential evacuation system 1-7 shown in FIGS. 10 and 11 differs from the above-described differential evacuation system 1-6 shown in FIG. 8 in that the light generation chamber 10 has the same arrangement as that of the light generation chamber 10 shown in FIG. 4, and in that the pipes 25 and 25-2 are bent in the axial direction (i.e. in the direction of the center axis of the chamber connecting passage 150) and further that the vacuum pumps 170 and 170-2 are attached to the respective distal ends of the pipes 25 and 25-2, thereby installing the rotating shafts of the vacuum pumps 170 and 170-2 in parallel to the center axis of the chamber connecting passage 150. The vacuum pumps 170 and 170-2 as installed in this orientation do not project outward (radially) and allow a reduction in the external size of the differential evacuation system 1-7, in the same way as described in connection with the first embodiment.

FIG. 12 is a schematic view showing the arrangement of a main part of a differential evacuation system 1-8 according to an eighth embodiment of the present invention. The differential evacuation system 1-8 shown in FIG. 12 differs from the above-described differential evacuation system 1-1 shown in FIG. 1 in that the chamber connecting passage 150 is formed in a tubular configuration in which the inner diameter of the chamber connecting passage 150 increases toward one of the two chambers 10 and 100 from the flow path constricting portion 151 where the inner diameter is the smallest. More specifically, the chamber connecting passage 150 has a configuration in which a portion thereof at one side of the flow path constricting portion 151 is increased in inner diameter in a conical tube shape (i.e. a configuration in which the flow path constricting portion 151 is connected to the illumination optical chamber 100, and the chamber connecting passage 150 expands in a conical tube shape toward the light generation chamber 10). In addition, an enlarged-diameter part 160 is provided at an intermediate position of the chamber connecting passage 150 (i.e. a position near the flow path constricting portion 151 of the chamber connecting passage 150). The enlarged-diameter part 160 has an inner diameter larger than those of portions of the chamber connecting passage 150 that are at opposite sides, respectively, of the enlarged-diameter part 160. The enlarged-diameter part 160 and a plurality (four) of vacuum pumps 170 attached to the enlarged-diameter part 160 are arranged in the same way as in the first embodiment. The differential evacuation system 1-8 arranged as stated above can also provide advantageous effects as in the case of the first embodiment. That is, it is possible to reduce the conductance of the chamber connecting passage 150 by the flow path constricting portion 151, and to sufficiently ensure an optical path diverging in opposite directions away from each other from the point of convergence of light passing through the chamber connecting passage 150 by making the light convergence point coincident with the flow path constricting portion 151. It is also possible to easily install a plurality of vacuum pumps 170 by attaching them to the enlarged-diameter part 160 provided at an intermediate position of the chamber connecting passage 150 and hence possible to increase the differential pressure between the light generation chamber 10 and the illumination optical chamber 100. The differential evacuation system 1-8 also has a plurality of vacuum pumps 170 attached to one side of the enlarged-diameter part 160. Therefore, the vacuum pumps 170 can be installed so as not to project outward, which allows a reduction in the external size of the differential evacuation system 1-8. It should be noted that the vacuum pumps 170 may be attached to the outer peripheral surface of the enlarged-diameter part 160 as in the differential evacuation system 1-5 shown in FIGS. 6 and 7. The differential evacuation system 1-8 arranged in this way is suitable for use in a situation where there is a space in the radial direction of the enlarged-diameter part 160 but there is no much space in the axial direction of the enlarged-diameter part 160 as in the case of the differential evacuation system 1-5.

Although some embodiments of the present invention have been described above, the present invention is not limited to the foregoing embodiments but can be modified in a variety of ways without departing from the appended claims and the scope of the technical idea described in the specification and the accompanying drawings. It should be noted that any configuration or structure that offers the operation/working-effect of the invention in this application is within the scope of the technical idea of the invention in this application even if it is not directly mentioned in the specification or the drawings. For example, although in the foregoing embodiments the present invention is used in an exposure apparatus for semiconductor manufacture, the present invention is not limited thereto but may also be used for other applications, e.g. a reflectance measuring device, a wavefront measuring device, a microscope, a shape measuring device, a clinical device, a chemical composition analyzer, a structure analyzer, and so forth. Although the foregoing embodiments use turbomolecular pumps as vacuum pumps, it is also possible to use vacuum pumps of various other structures. Further, various changes may be made to the position and number of enlarged-diameter parts 160 installed and the position and number of vacuum pumps 170 installed, needless to say. For example, vacuum pumps 170 (170-2) may be attached to both the right and left sides of the enlarged-diameter part 160 (160-2). Although the chamber connecting passage 150 used in the foregoing embodiments is in the shape of a conical tube, it is possible to adopt any of various other shapes in place of the conical tube shape, for example, a shape in which a circular cylindrical tube is increased in inner diameter for every predetermined length (i.e. the inner diameter is increased stepwise). In short, the chamber connecting passage 150 may have any shape, provided that its inner diameter gradually increases from the flow path constricting portion 151. Further, although the foregoing embodiments use He gas as an example of buffer gas blown onto the surface of the converging mirror 15 in order to prevent the degradation of the reflectance of the converging mirror 15, the buffer gas used in the present invention is not limited to He gas. It is possible to use any gas (Ar, Ne, etc.) that has a high transmittance for EUV light. It is also possible to use any gas (e.g. HBr, HCl, etc.) that etches Sn adhered to the surface of the converging mirror 15 and that has a high transmittance for EUV light.

LIST OF REFERENCE SIGNS

Figure 1:
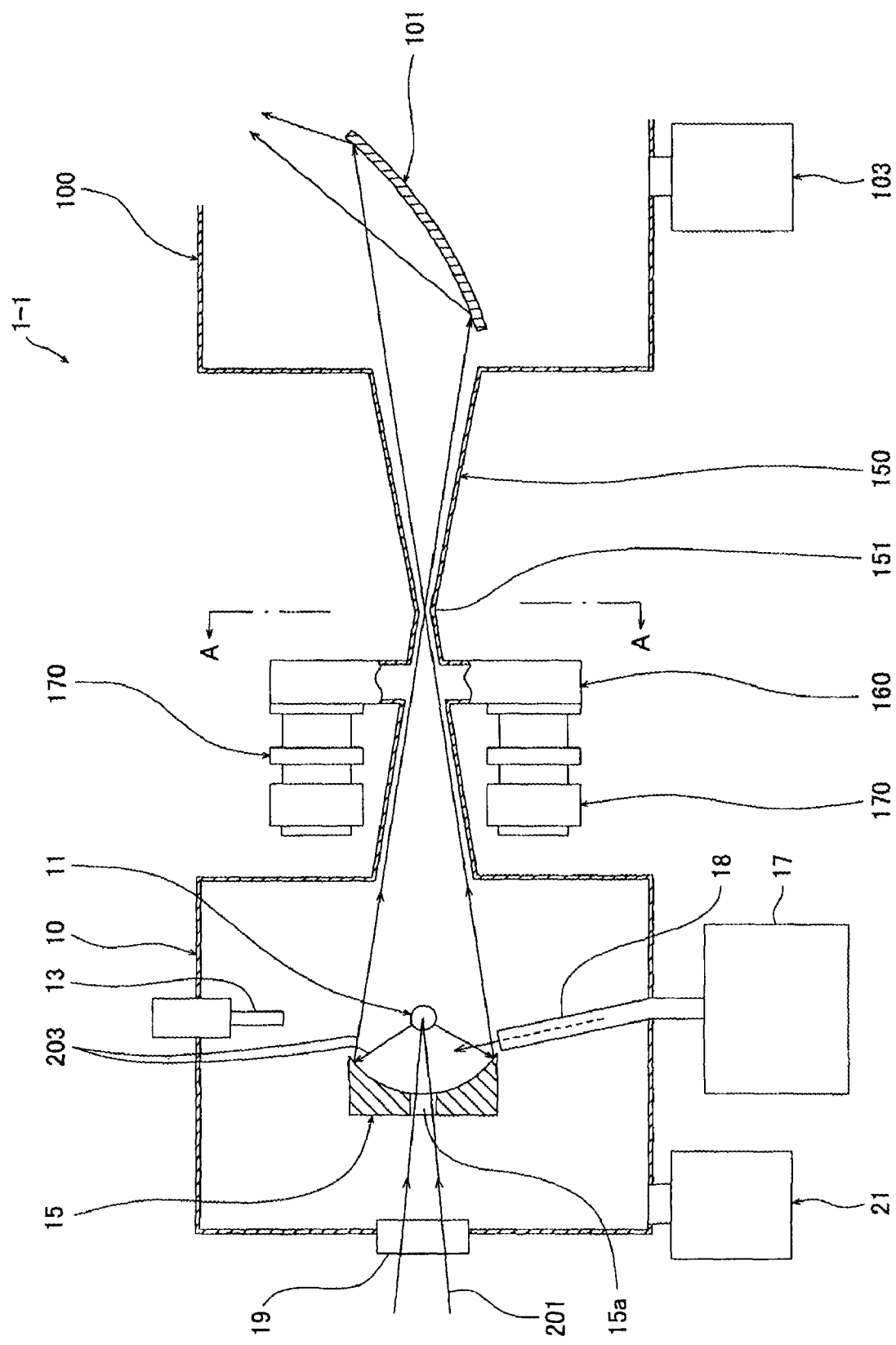
FIG. 1 is a schematic view showing the arrangement of a main part of a differential evacuation system 1-1.
Figure 2:
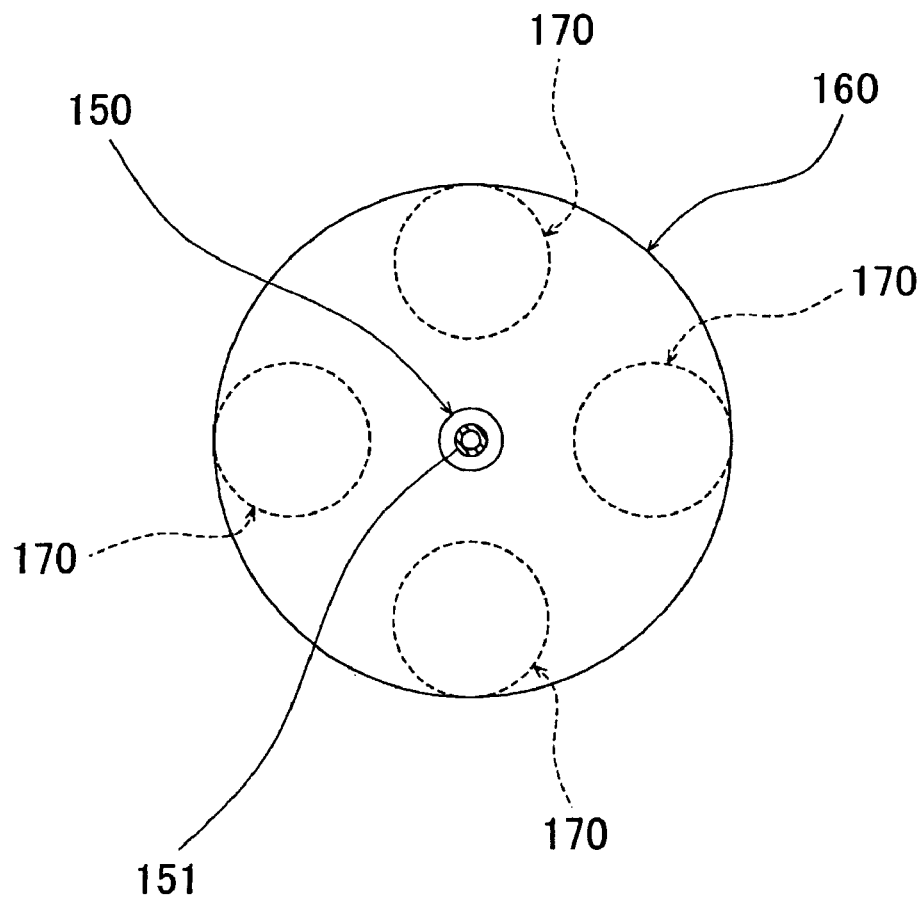
FIG. 2 is a partly sectioned view as seen in the direction of the arrows A-A in FIG. 1.
Figure 3:
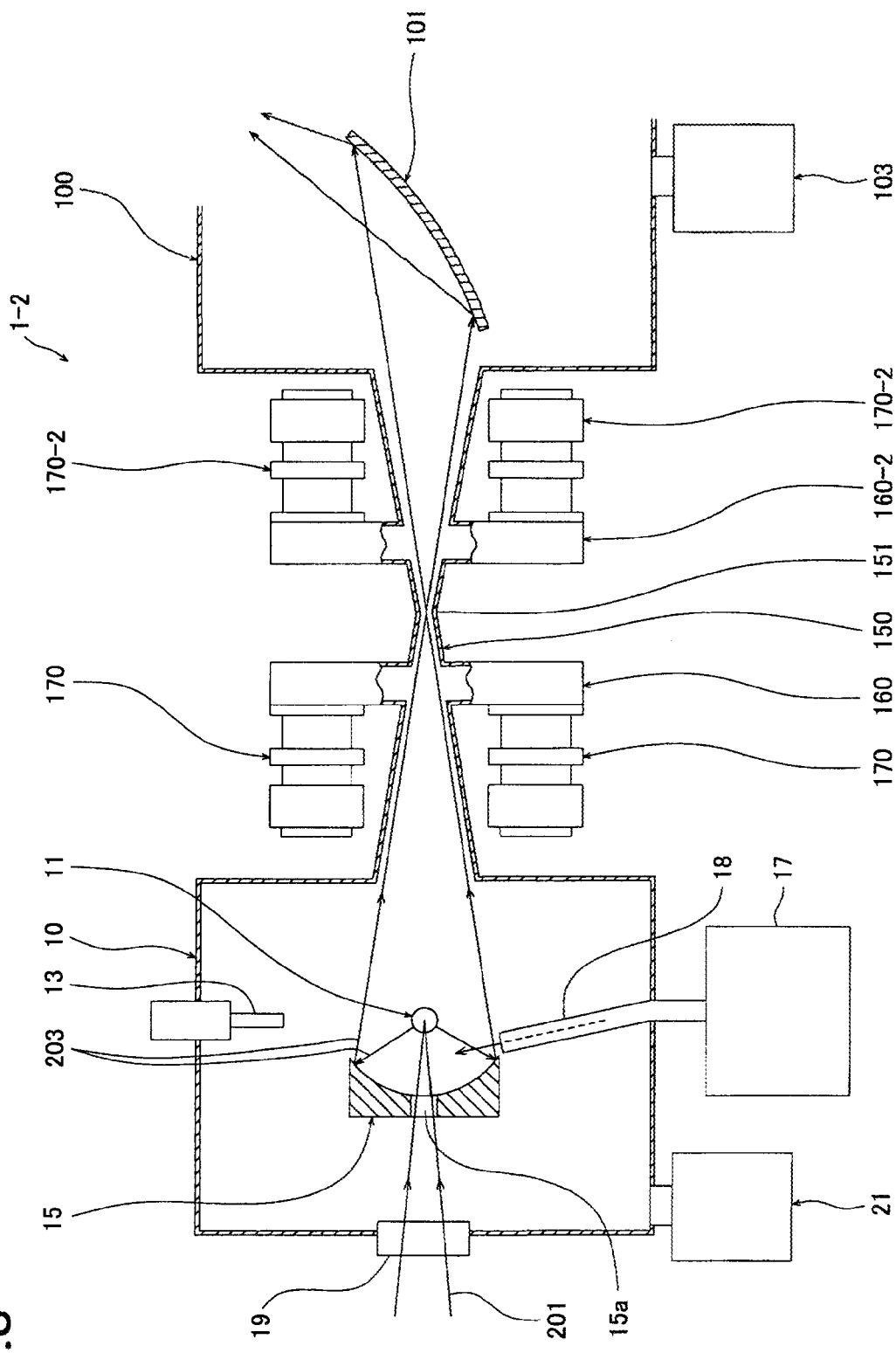
FIG. 3 is a schematic view showing the arrangement of a main part of a differential evacuation system 1-2.
Figure 4:
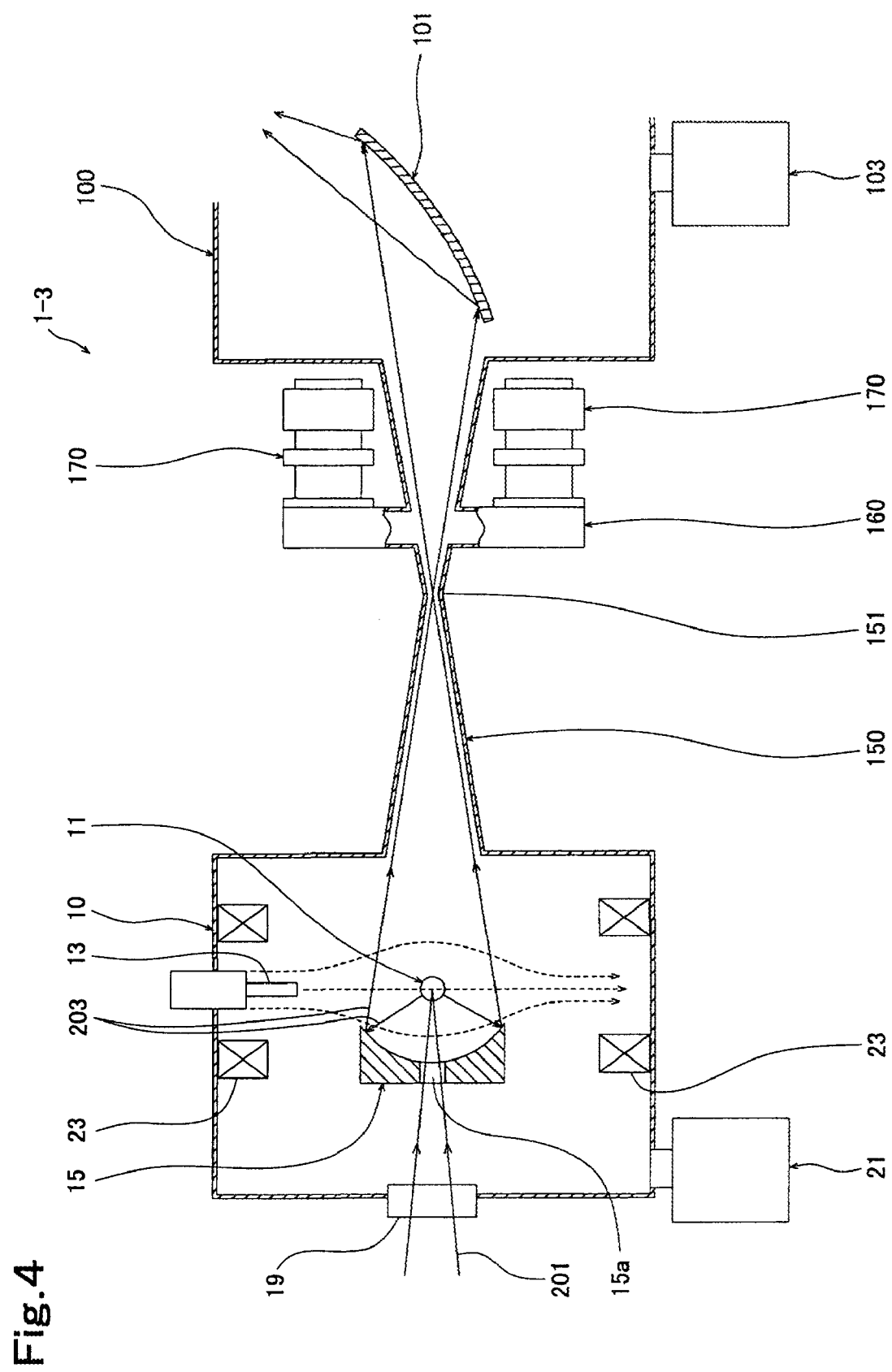
FIG. 4 is a schematic view showing the arrangement of a main part of a differential evacuation system 1-3.
Figure 5:
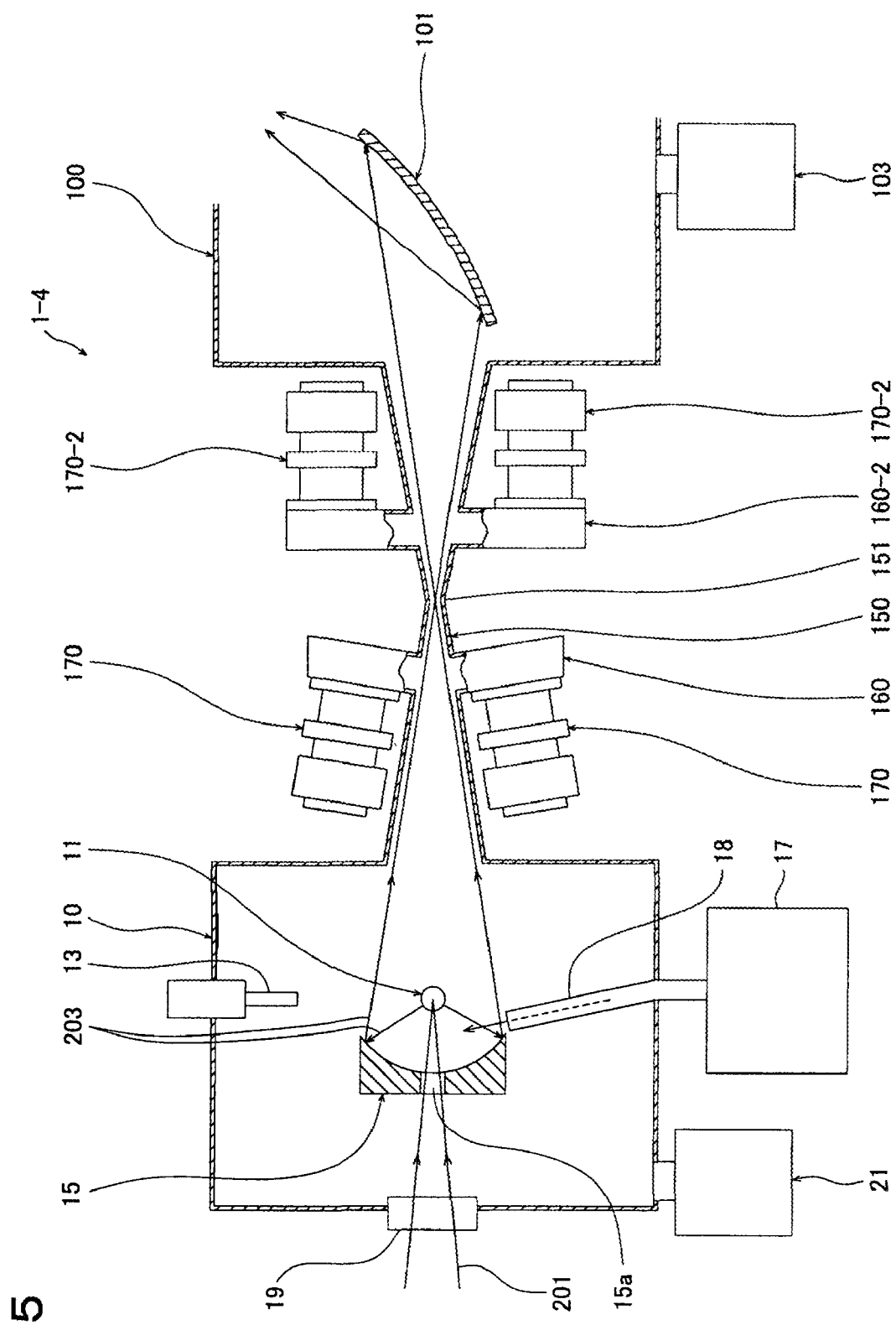
FIG. 5 is a schematic view showing the arrangement of a main part of a differential evacuation system 1-4.
Figure 6:
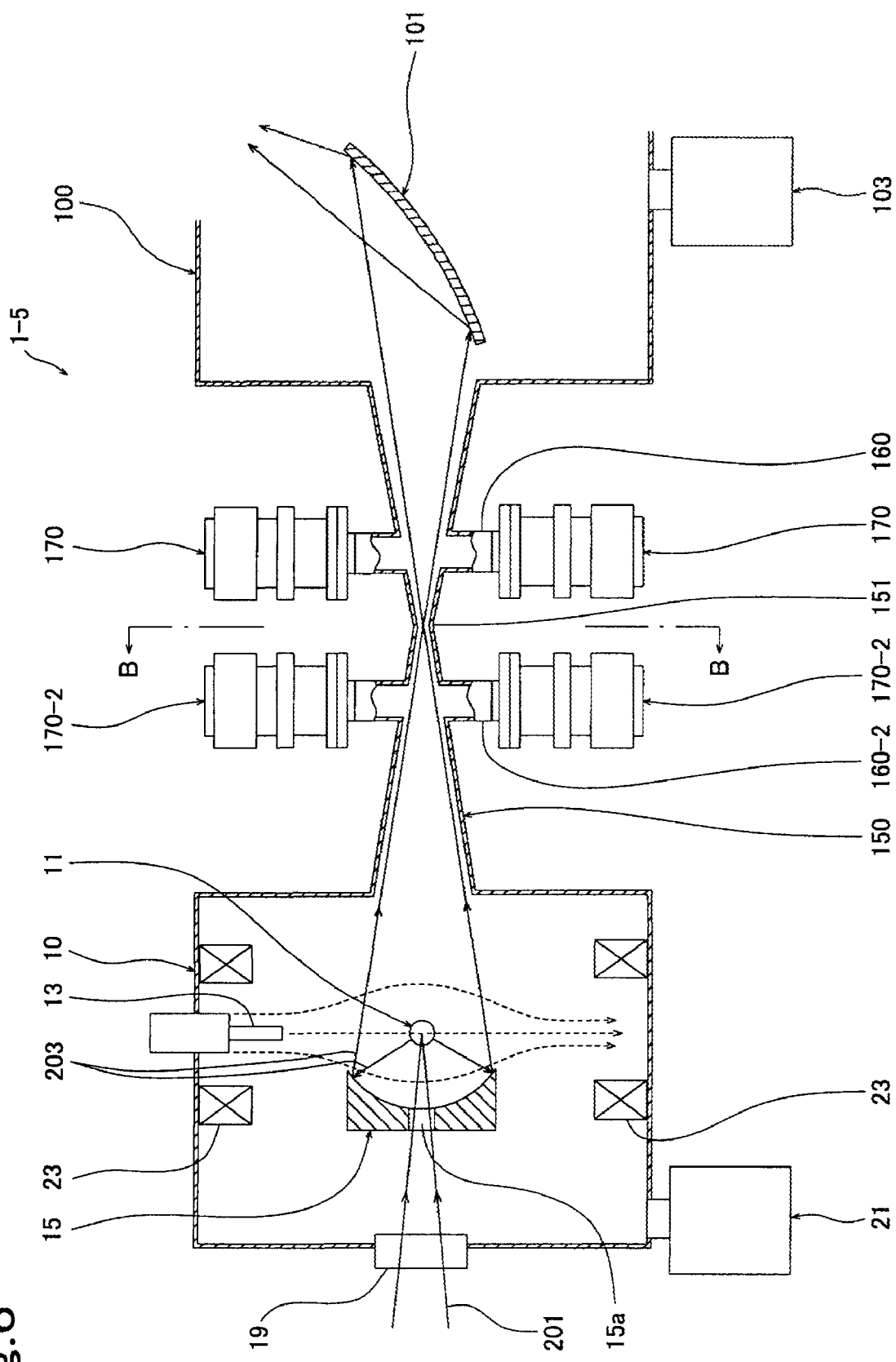
FIG. 6 is a schematic view showing the arrangement of a main part of a differential evacuation system 1-5.
Figure 7:
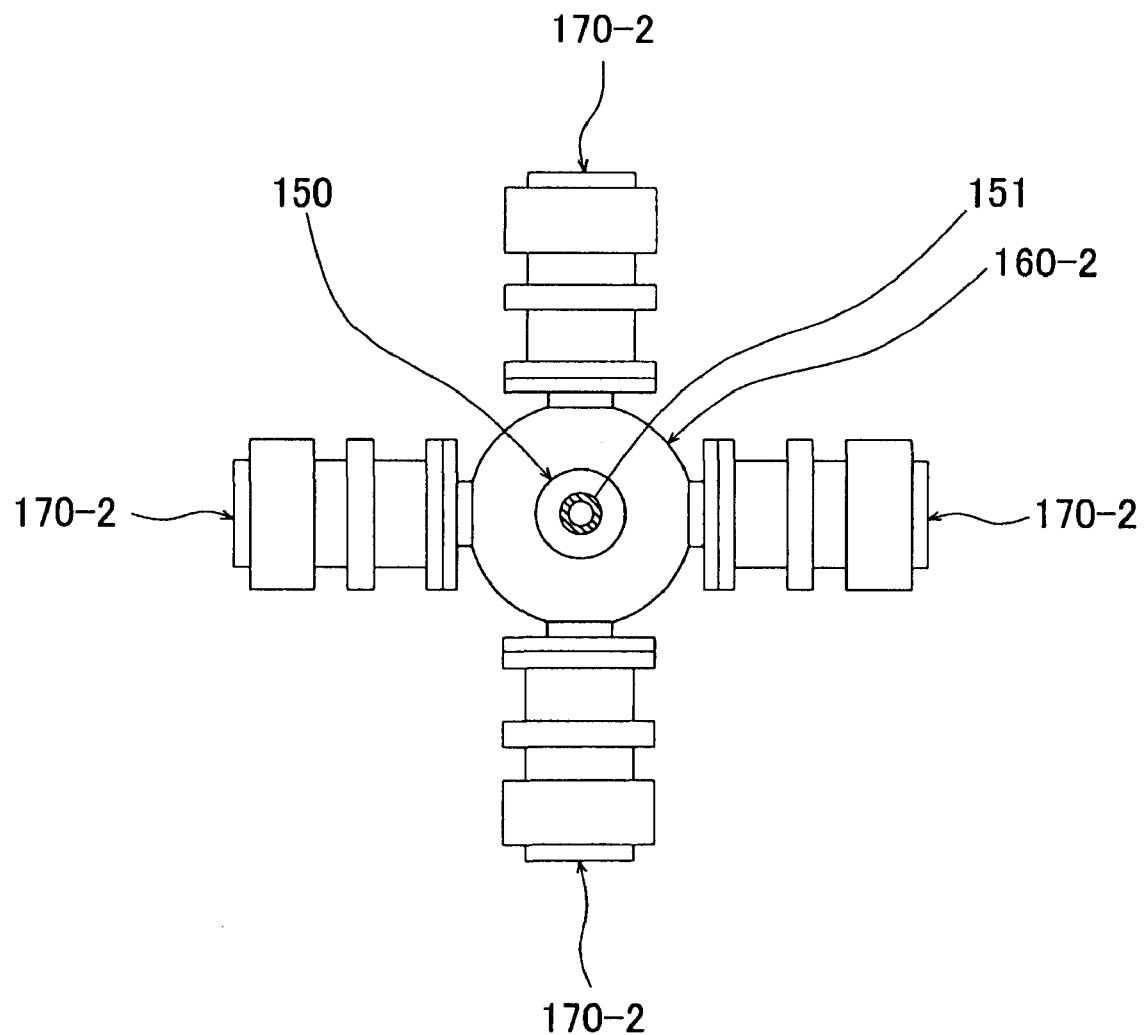
FIG. 7 is a partly sectioned view as seen in the direction of the arrows B-B in FIG. 6.
Figure 8:
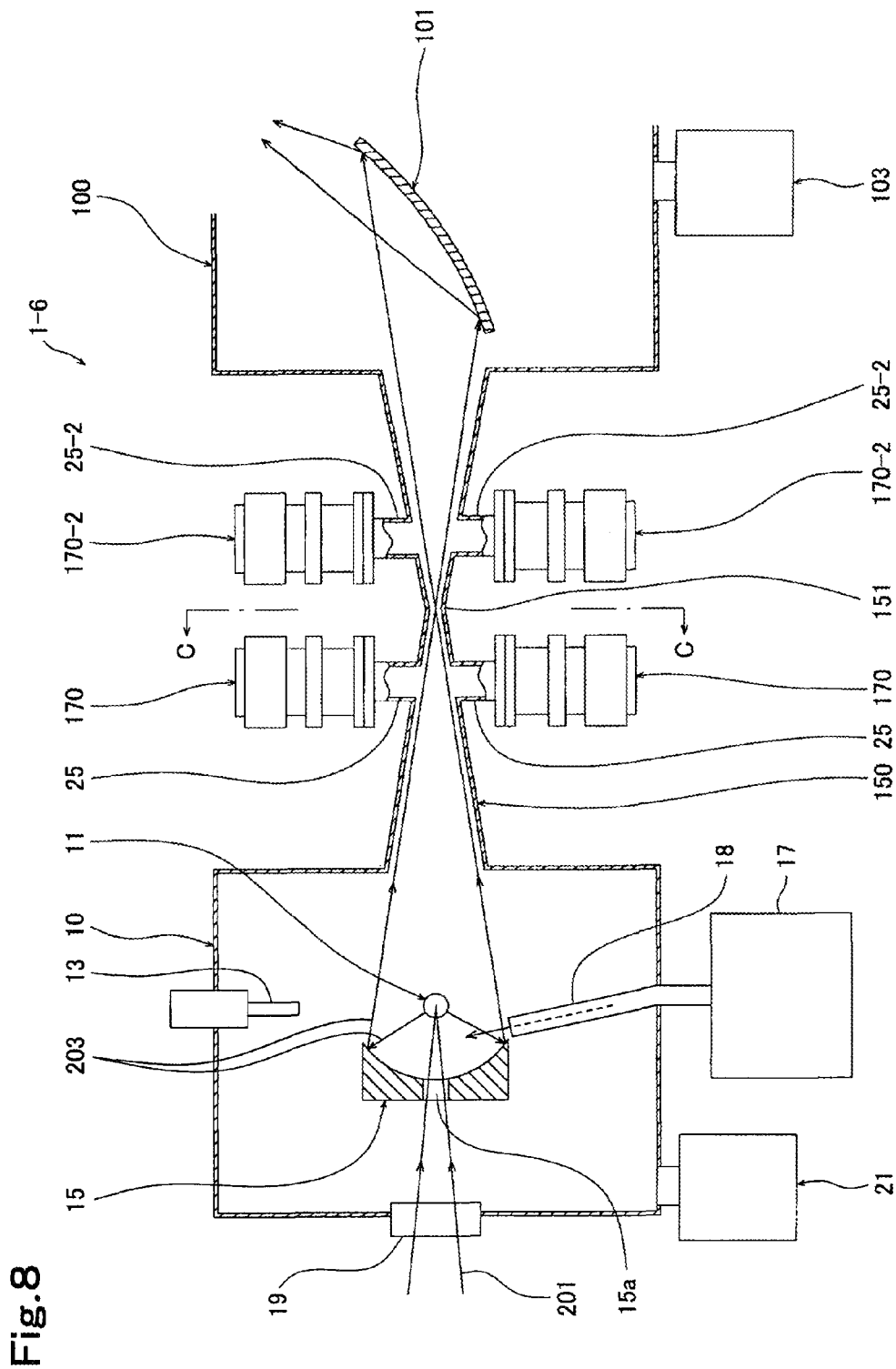
FIG. 8 is a schematic view showing the arrangement of a main part of a differential evacuation system 1-6.
Figure 9:
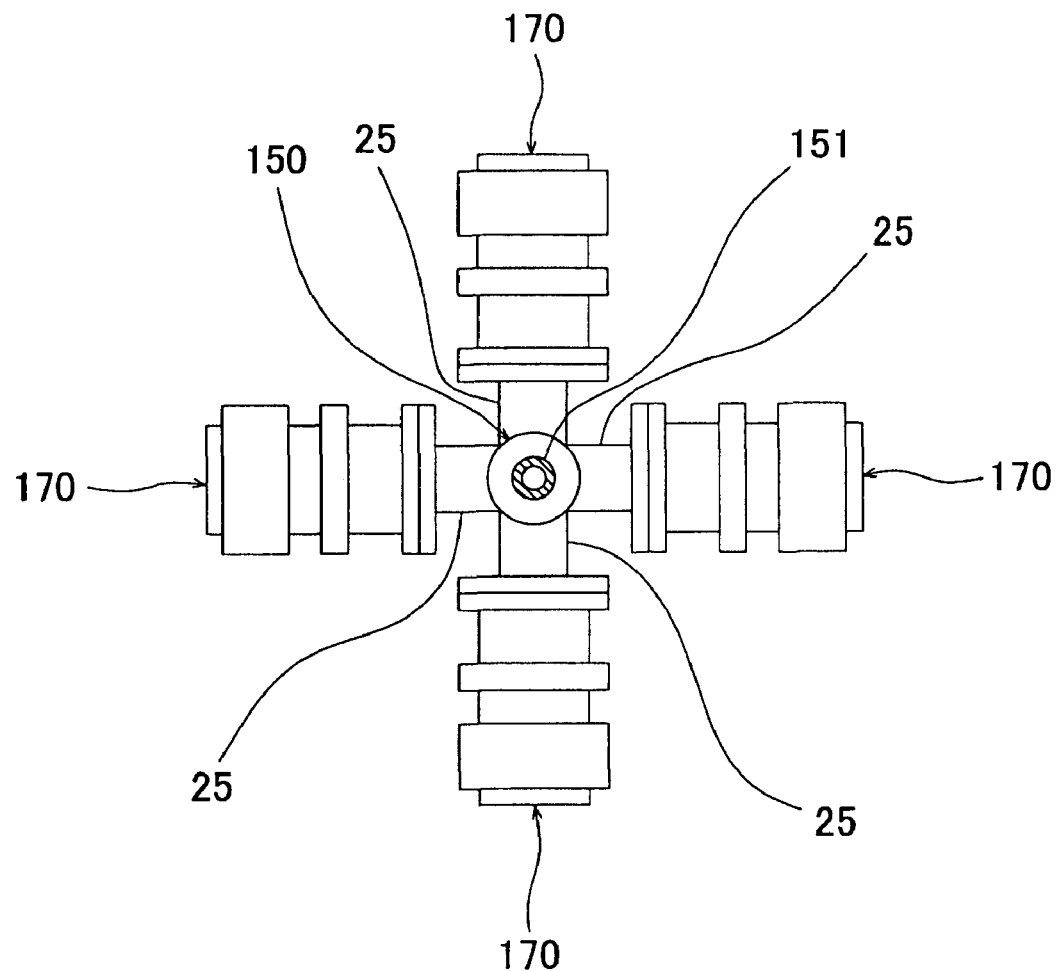
FIG. 9 is a partly sectioned view as seen in the direction of the arrows C-C in FIG. 8.
Figure 10:
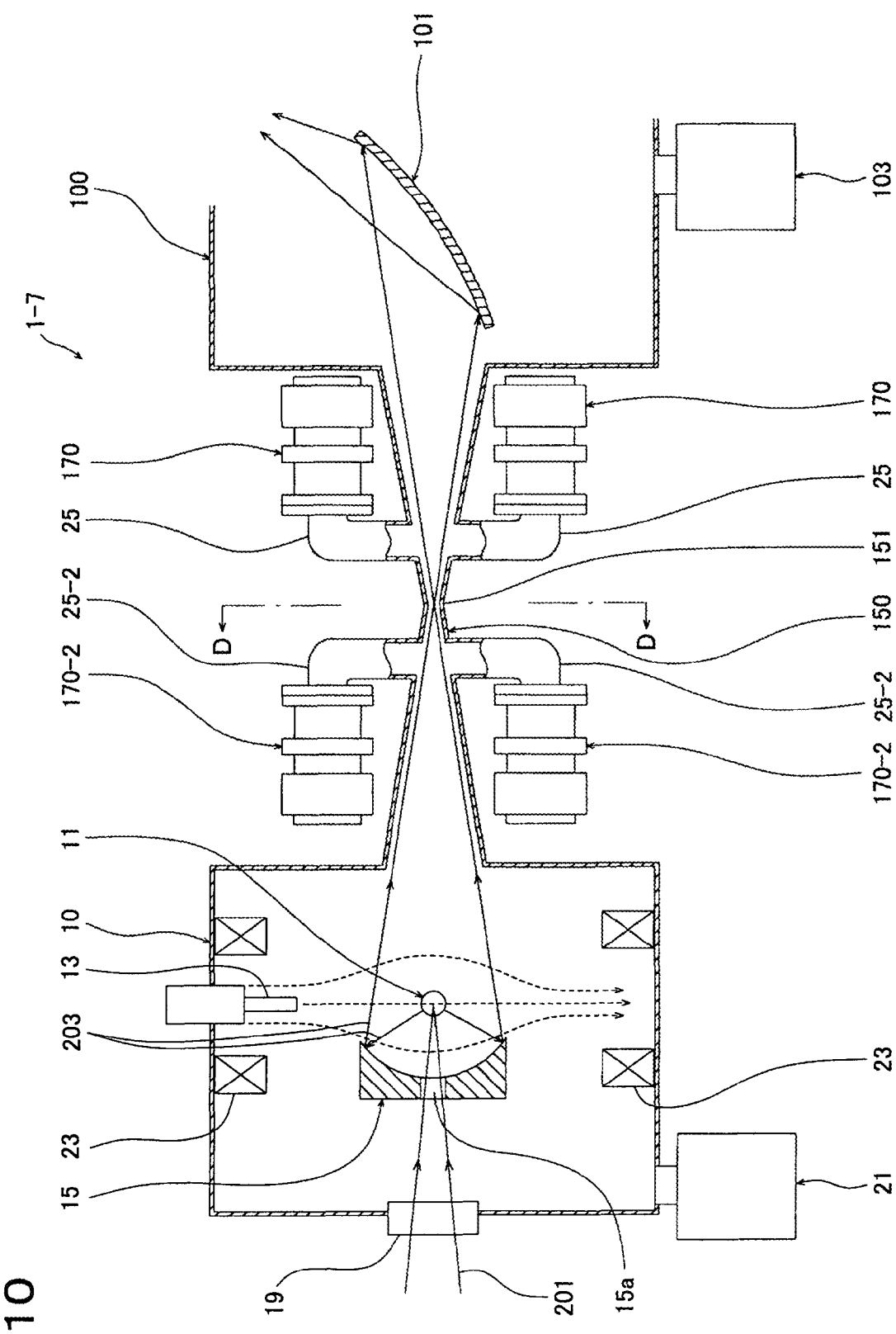
FIG. 10 is a schematic view showing the arrangement of a main part of a differential evacuation system 1-7.
Figure 11:
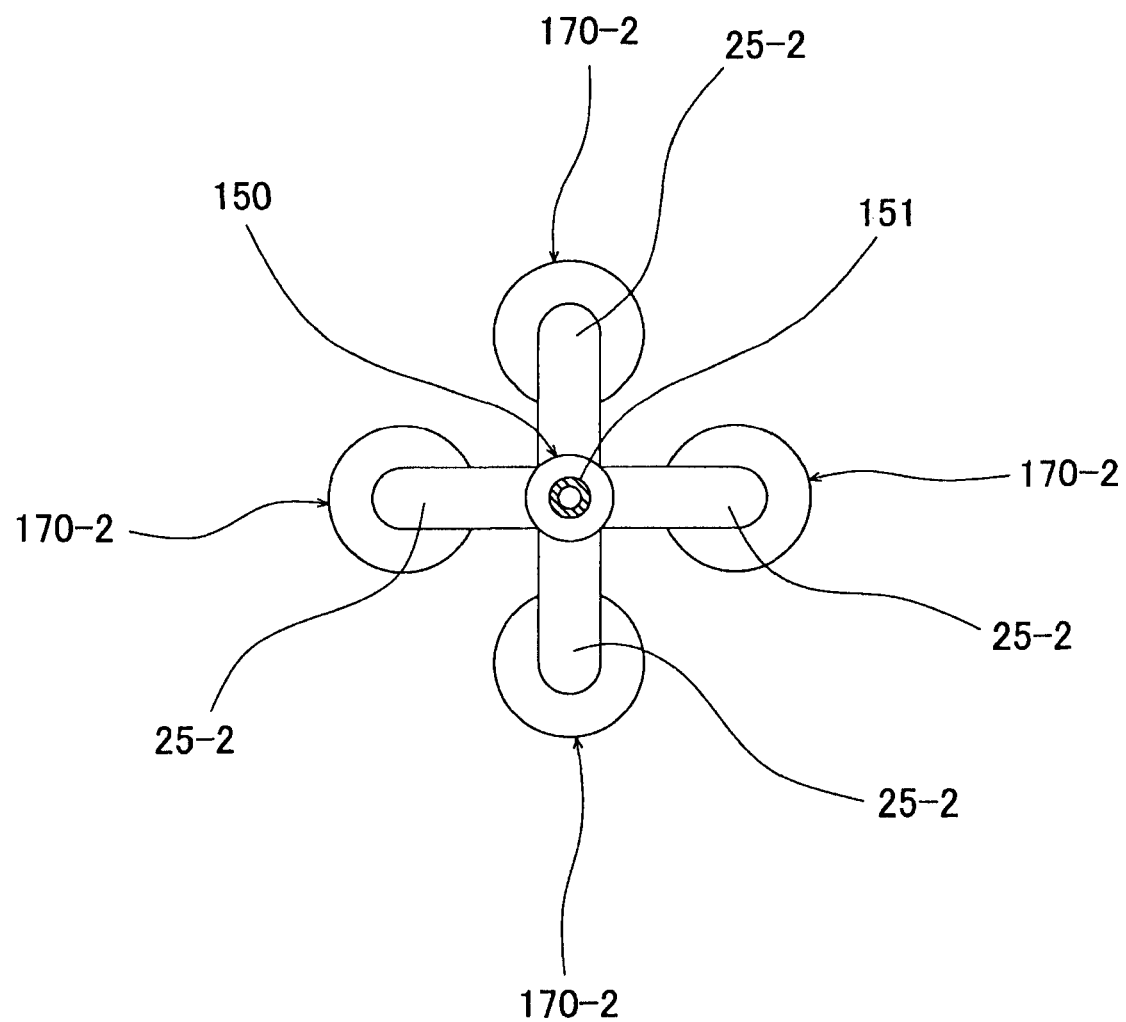
FIG. 11 is a partly sectioned view as seen in the direction of the arrows D-D in FIG. 10.
Figure 12:
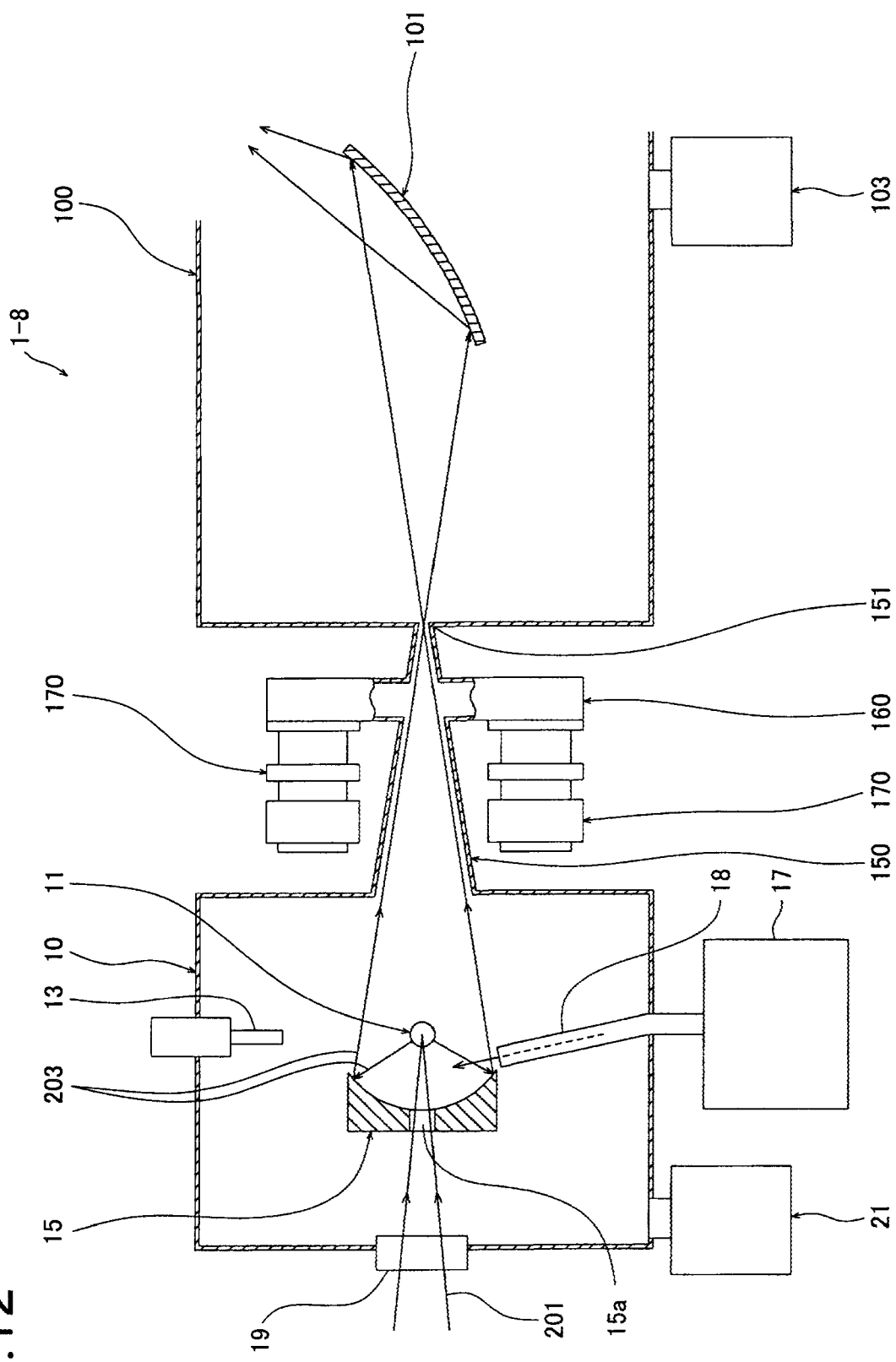
FIG. 12 is a schematic view showing the arrangement of a main part of a differential evacuation system 1-8.

1-1: differential evacuation system
10: light generation chamber
11: plasma
13: nozzle
15: converging mirror
15a: light-passing hole
17: buffer gas introducing tank
18: nozzle
19: transmitting window
21: vacuum pump
23: superconducting magnet
100: illumination optical chamber
101: optical element
103: vacuum pump
150: chamber connecting passage
151: flow path constricting portion
160: enlarged-diameter part
160-2: enlarged-diameter part
170: vacuum pump
170-2: vacuum pump
203: EUV light
1-2: differential evacuation system
1-3: differential evacuation system
1-4: differential evacuation system
1-5: differential evacuation system
1-6: differential evacuation system
25, 25-2: pipe
1-7: differential evacuation system
1-8: differential evacuation system

The invention claimed is:
1. A differential evacuation system comprising:
a light generation chamber that generates EUV (Extreme Ultra Violet) light;
an illumination optical chamber in which optical processing is performed by using the EUV light;

a light converging mirror arranged in the light generation chamber and converging the EUV light thus generated;
a chamber connecting passage that connects together the light generation chamber and the illumination optical chamber to allow the EUV light to pass therethrough;
an optical element arranged in the illumination optical chamber and reflecting the EUV light that has passed through the chamber connecting passage;
a flow path constricting portion provided in the chamber connecting passage and obstructing a gas to pass therethrough; said flow path constriction portion with a smallest inner diameter and being increased in inner diameter in a conical tube shape at portions thereof that are at opposite sides, respectively, of said flow path constriction portion; and
one or a plurality of vacuum pumps disposed in a position closer to the light generation chamber than the flow path constricting portion and evacuating the chamber connecting passage.

2. The differential evacuation system of claim 1, further comprising one or a plurality of pipes connected to a position of the chamber connecting passage that is closer to the light generation chamber and the flow path constricting portion,
wherein the one or the plurality of vacuum pumps are connected to the one or the plurality of pipes.

3. The differential evacuation system of claim 1, further comprising a gas introducing device that feeds a gas onto a surface of the light converging mirror.

4. The differential evacuation system of claim 1,
wherein the gas fed onto the surface of the light converging mirror contains He, Ne, or Ar.

5. The differential evacuation system of claim 1,
wherein the gas fed onto the surface of the light converging mirror contains hydrogen.

6. The differential evacuation system of claim 1, further comprising a magnetic field generation device that generates a magnetic field around the light converging mirror.

7. The differential evacuation system of claim 1,
wherein the light generation chamber is provided with a laser transmitting window for introducing laser light into the light generation chamber.

8. A differential evacuation system comprising:
a light generation chamber that generates light;
an illumination optical chamber in which optical processing is performed by using the light generated in said light generation chamber; and
a chamber connecting passage serving as a light passage that connects together said light generation chamber and illumination optical chamber to guide the light generated in the light generation chamber into the illumination optical chamber;
said chamber connecting passage having a flow path constricting portion with a smallest inner diameter and being increased in inner diameter in a conical tube shape at portions thereof that are at opposite sides, respectively, of said flow path constricting portion;
wherein one or a plurality of vacuum pumps are attached to each of the portions that are at opposite sides, respectively, of said flow path constricting portion.

9. The differential evacuation system of claim 8, wherein the portions of said chamber connecting passage that are at opposite sides, respectively, of the flow path constricting portion are provided with enlarged-diameter parts, respectively, said one or plurality of vacuum pumps being attached to each of the enlarged-diameter parts.

10. The differential evacuation system of claim 9, wherein said plurality of vacuum pumps are attached to a side of each of said enlarged-diameter parts.

11. The differential evacuation system of claim 9, wherein said plurality of vacuum pumps are attached to an outer peripheral surface of each of said enlarged-diameter parts.

12. The differential evacuation system of claim 8, wherein one or a plurality of pipes are connected to each of the portions of said chamber connecting passage that are at opposite sides, respectively, of the flow path constricting portion, said vacuum pumps being attached to the pipes, respectively.

13. A differential evacuation system comprising:
a light generation chamber that generates light;
an illumination optical chamber in which optical processing is performed by using the light generated in said light generation chamber; and
a chamber connecting passage serving as a light passage that connects together said light generation chamber and illumination optical chamber to guide the light generated in the light generation chamber into the illumination optical chamber;
said chamber connecting passage having a flow path constricting portion with a smallest inner diameter and being increased in inner diameter from the flow path constricting portion toward at least one of the light generation chamber and the illumination optical chamber;
wherein an enlarged-diameter part is provided at an intermediate position of the chamber connecting passage, and one or a plurality of vacuum pumps are attached to the enlarged-diameter part.

14. The differential evacuation system of claim 13, wherein said plurality of vacuum pumps are attached to a side of said enlarged-diameter part.

15. The differential evacuation system of claim 13, wherein said plurality of vacuum pumps are attached to an outer peripheral surface of said enlarged-diameter part.

\* \* \* \* \*